United States Patent [19]

Sagong et al.

[11] Patent Number: 5,043,622
[45] Date of Patent: Aug. 27, 1991

[54] EASILY POLED 0-3 PIEZOELECTRIC COMPOSITES FOR TRANSDUCER APPLICATIONS

[75] Inventors: Geon Sagong; Ahmad Safari; Sei-Joo Jang, all of State College, Pa.

[73] Assignee: Hoechst Celanese Corp., Somerville, N.J.

[21] Appl. No.: 531,742

[22] Filed: Jun. 1, 1990

Related U.S. Application Data

[60] Division of Ser. No. 22,519, Mar. 6, 1987, Pat. No. 4,944,891, which is a continuation of Ser. No. 742,333, Jun. 7, 1985.

[51] Int. Cl.$^5$ ............................................ H01L 41/08
[52] U.S. Cl. .................................. 310/358; 252/62.9; 29/25.35
[58] Field of Search ............................. 310/357–359, 310/311; 29/25.35; 252/62.9; 428/242

[56] References Cited

U.S. PATENT DOCUMENTS 4,726,099  2/1988  Card et al. ..................... 310/358 X
4,933,230  6/1990  Card et al. ..................... 310/358 X

FOREIGN PATENT DOCUMENTS 0208019  1/1987  European Pat. Off. ............ 310/358
0247734  12/1987 European Pat. Off. ............ 310/358
0219188  9/1986  Japan ................................. 310/358
0283181  12/1986 Japan ................................. 310/358

*Primary Examiner*—Mark O. Budd
*Attorney, Agent, or Firm*—Depaoli & O'Brien

[57] ABSTRACT

A PET-polymer composite of 0-3 connectivity further includes a third phase particulate additive of conductive or semiconductive material to increase the electrical conductivity of the polymer matrix.

11 Claims, 1 Drawing Sheet

EASILY POLED 0-3 PIEZOELECTRIC COMPOSITES FOR TRANSDUCER APPLICATIONS

This application is a division of application Ser. No. 022,519, filed Mar. 6, 1987 now U.S. Pat. No. 4,944,891, issued Jul. 31, 1990, which is a continuation of application Ser. No. 742,333, filed June 7, 1985.

BACKGROUND OF THE INVENTION

This invention is related to piezoelectric materials and, more particularly, to a 0-3 PZT-polymer composite for transducer applications and the like.

Piezoelectricity can be explained as electric polarization produced by mechanical stress in certain substances. Piezoelectric materials, such as lead zirconate titanate (PZT), are used in a wide variety of applications. In hydrophone devices piezoelectric materials detect low frequency acoustic waves passively. Hydrophones are frequently made from single phase PZT. Large hydrostatic piezoelectric charge and voltage coefficients ($d_h$ and $g_h$) are desired in these devices. Thus, even though the magnitudes of the piezoelectric coefficients $d_{33}$ and $d_{31}$ of PZT are large, the hydrostatic coefficients $d_h$ and $g_h$ are small, because the $d_{33}$ and $2d_{31}$ coefficients are almost equal and opposite in sign, and also, the dielectric constant of PZT is large. The large difference of the acoustic impedance between PZT and water requires impedance matching layers for underwater hydrophone applications.

In order to improve and modify material properties for hydrophone devices, several different types of piezoelectric PZT-polymer composites have been recently investigated utilizing the concept of phase connectivity. It has been found that the electric flux pattern and the mechanical stress distribution together with the resulting physical and piezoelectric properties depend strongly on the manner in which the individual piezoelectric and polymer phases of the diphasic composites are interconnected. Each phase in a composite may be self-connected in zero, one, two, or three dimensions. Thus, a diphasic 2-1 connectivity pattern, for example, has one phase self-connected in two dimensional layers, the other in one dimensional chains or fibers. Below are represented some of the composite with different connectivity patterns in which the piezoelectric phase appears first.

- 0-3 composite: PZT particles suspended in a polymer matrix
- 1-3 composites: PZT rods aligned in the poling direction held together by a polymer matrix
- 1-3-0 composites: PZT rods aligned in the poling direction held together by a foamed polymer matrix
- 3-1 and 3-2 composites: holes drilled in a prepoled PZT block, then the holes filled or covered by polymer.
- 3-3 composites: lost-wax method using coral as the starting material, or by a fugitive phase method (BURPS process).

The $d_h$, $g_h$ coefficients and $d_h g_h$ figure of merit of the diphasic composites are significantly improved over single phase PZT due to decoupling of the $d_{33}$ and $d_{31}$ coefficients and/or the reduction of the dielectric constant.

The piezoelectric ceramic-polymer composites of 1-3, 1-3-0, 3-1, 3-2, and 3-3 connectivities are often expensive and cumbersome to fabricate. The PZT-polymer 0-3 composite is relatively easy and inexpensive to make. However, in 0-3 composites, early studies showed that the PZT particles should have a diameter greater than the thickness of the composites to obtain sufficient poling. For smaller particles of PZT, very large poling field strength ($\simeq$100–150 kV/cm) are needed to achieve sufficient poling.

For a 0-3 composite consisting of spherical grains embedded in a matrix, the electric field $E_1$, acting on an isolated spherical grain is give by $$E_1 = \frac{3K_2}{K_1 + 2K_2} E_0.$$

In this equation, $K_1$ and $K_2$ are the dielectric constants of the spherical piezoelectric grains and the polymer matrix, respectively, and $E_0$ is an externally applied electric field. For a 0-3 composite of PZT powder and polymer, $K_1$ is about 2000 and $_2$ about 5. In such a composite with an external field of 100 kV/cm, the electric field acting on the piezoelectric particles is only about 1 kV/cm which is insufficient to pole the composite. According to the above equation $E_1 \sim E_0$ only when the dielectric constant of the piezoelectric phase approaches that of the polymer phase. Most of the ferroelectric materials have very high dielectric constants and hence the above condition cannot be satisfied.

One way to meet this poling difficulty is to raise the polymer matrix conductivity. In Japanese Kokai No. 56-93383, July 28, 1981, a piezoelectric material is prepared by dispersing fine piezoelectric ceramic powder in a high permittivity polymer matrix consisting of an insulating polymer and an organic substance with high conductivity.

SUMMARY OF THE INVENTION

In accordance with the present invention, a piezoelectric-polymer composite of 0-3 connectivity having improved poling field strength is fabricated by increasing the electrical conductivity of the polymer phase. In a particular method, a third phase of metallic or semiconductive material in particulate form is added to the polymer matrix to enhance the polymer matrix conductivity. As a result, the conductivity of the polymer matrix will increase to about $10^{-6}$ ohm$^{-1}$cm$^{-1}$ and that of the composite as a whole will increase to $10^{-10}$ ohm$^{-1}$cm$^{-1}$.

Increasing the conductivity of the polymer phase in the PZT-polymer 0-3 composite greatly improves the poling conditions and consequently, inexpensive and useful 0-3 piezoceramic-polymer composite can be fabricated.

BRIEF DESCRIPTIONS OF THE DRAWING

DESCRIPTION OF THE PREFERRED EMBODIMENTS

Figure 1:
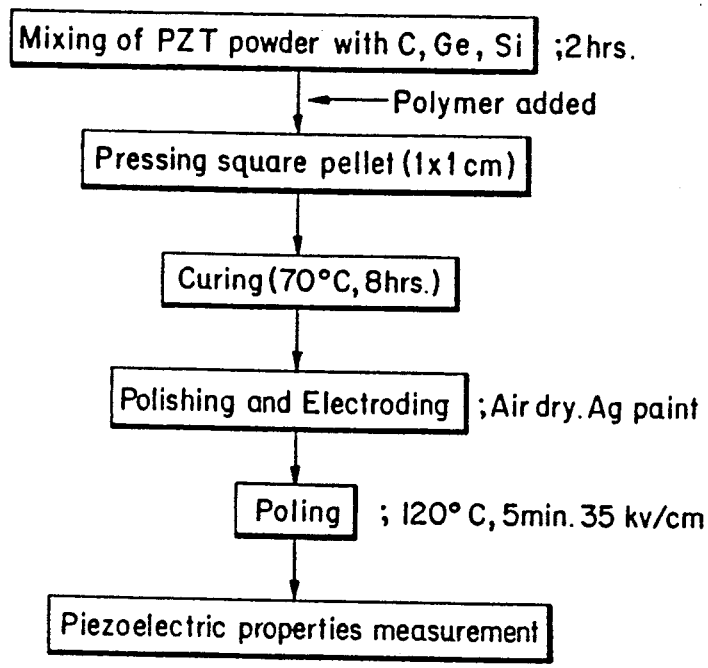
FIG. 1 is a flow chart of the process steps for forming the 0-3 piezoelectric-polymer composites of the Example.

In accordance with the present invention, a piezoelectric ceramic-polymer composite of 0-3 connectivity is prepared by blending a piezoelectric ceramic powder and a particulate additive having conductive or semiconductive properties as a third phase into an insulating polymer matrix.

The conductive or semiconductive phase may comprise an inorganic or organic substance in particulate form. Among the various particulate additives which can be utilized include carbon, germanium, silicon, and metals such as silver, etc. Organic compounds may include tetracyanoquinodimethane (TCNQ). Generally, the conductive or semiconductive third phase should have a conductivity of at least $10^{-3} ohm^{-1} cm^{-1}$.

Any polymeric material with high insulating property able to be blended with the piezoelectric ceramic powder and third phase conductive or semiconductive additive and capable of forming thin films can be used but the selection should be carefully considered according to the performance demanded.

It is preferable for the polymer matrix to have as low as dielectric loss as possible. The examples of such polymers include polystyrene, polysulfone, polycarbonate, polypropylene, polyethylene, polyethylene terephthalate, polyphenylene oxide, polyurethane elastomer, polyvinyl carbazole and polyvinylidene fluoride. The mixtures of the aforementioned polymers and the copolymers of the aforementioned polymers could also be used. On the other hand if a low dielectric loss is not required any polymer could be used and the selection can be based on the ability to form thin films, heat resistance, mechanical properties, electrical properties and strength. For example, polyacrylate esters, polymethacrylate esters, polyvinyl chloride, polyvinylidenes, polymers of acrylonitrile, polymers of methacrylonitriles, polyvinyl acetate, polyvinyl pyrrolidone, cellulose type polymers such as ethyl cellulose, soluble polymers of polyimide, epoxy resins, curable polymers such as unsaturated polyester resins can be used. The mixtures of the aforementioned polymers and the copolymers of aforementioned polymers could be used.

It is preferable to blend less than 4 vol. % of the conducting or semiconducting third phase particulate into the polymer matrix. The amount of the third phase additive will depend upon the conductivity thereof. Thus, depending upon the conductivity of the third phase additive, about 1.5 to about 4 vol. % will be incorporated into the polymer matrix.

The piezoelectric phase can be selected from among any of the piezoelectric ceramic powders including quartz, barium titanate, lead titanate, lead niobate, PZT, etc,. The amount of fine piezoelectric ceramic powder used should be preferably selected so that the level of piezoelectric ceramic content is about 60 to about 70 vol. % of the piezoelectric ceramic-polymer composite. Although the piezoelectric ratio of the 0-3 composite obtained increases with the increasing amount of piezoelectric powder used, the mechanical properties and operation properties are adversely affected by the increasing level of piezoelectric ceramic phase. Thus, it is preferably to select the amount of piezoelectric ceramic powder to the range specified above. Table 1 illustrates piezoelectric materials which are useful in this invention.

TABLE 1

(1) Single component:
$BaTiO_3$, $PbTiO_3$, $PbNb_2O_6$,
$(Na_{\frac{1}{2}}Bi_{\frac{1}{2}})TiO_3$, $LiNbO_3$, $LiTaO_3$ (2) Two component:
$PbTiO_3—PbZrO_3$,
$PbTiO_3—Pb(Zn_{\frac{1}{3}}Nb_{\frac{2}{3}})O_3$,
$PbTiO_3—Pb(Cd_{\frac{1}{3}}W_{\frac{2}{3}})O_3$,
$PbTiO_3—Pb(In_{\frac{1}{2}}Nb_{\frac{1}{2}})O_3$,
$KNbO_3—NaNbO_3$,
$Cd_2Nb_2O_7—NaNbO_3$,
$PbNb_2O_6—BaNb_2O_6$ (3) Three component:
$PbTiO_3—PbZrO_3—Pb(Mg_{\frac{1}{3}}Nb_{\frac{2}{3}})O_3$,  —$Pb(Co_{\frac{1}{3}}Nb_{\frac{2}{3}})O_3$,
$PbTiO_3—PbZrO_3—Pb(Zn_{\frac{1}{3}}Nb_{\frac{2}{3}})O_3$,  —$Pb(Cd_{\frac{1}{3}}Nb_{\frac{2}{3}})O_3$,
$PbTiO_3—PbZrO_3—Pb(Mn_{\frac{1}{3}}Nb_{\frac{2}{3}})O_3$,  —$Pb(Ni_{\frac{1}{3}}Nb_{\frac{2}{3}})O_3$,
$PbTiO_3—PbZrO_3—Pb(Sb_{\frac{1}{2}}Nb_{\frac{1}{2}})O_3$,  —$Pb(Y_{\frac{1}{2}}Nb_{\frac{1}{2}})O_3$,
$PbTiO_3—PbZrO_3—Pb(Mg_{\frac{1}{2}}W_{\frac{1}{2}})O_3$,
$PbTiO_3—PbZrO_3—Pb(Co_{\frac{1}{2}}W_{\frac{1}{2}})O_3$,  —$Pb(Cd_{\frac{1}{2}}W_{\frac{1}{2}})O_3$,
$PbTiO_3—PbZrO_3—Pb(Mn_{\frac{1}{2}}Te_{\frac{1}{2}})O_3$,  —$Pb(Mn_{\frac{1}{2}}Sb_{\frac{1}{2}})O_3$,
$PbTiO_3—PbZrO_3—Pb(Ni_{\frac{1}{3}}Sb_{2/3})O_3$,  —$Pb(Fe_{\frac{1}{2}}Nb_{\frac{1}{2}})O_3$,
Others
$PbTiO_3—Ba(Zn_{\frac{1}{3}}Nb_{\frac{2}{3}})O_3—Pb(Zn_{\frac{1}{3}}Nb_{\frac{2}{3}})O_3$,
$KNbO_3—NaNbO_3—LiNbO_3$
$(Pb_{1-x}La_x)(Zr_yTi_z)_{1-x/4}O_3$    $(x - y = 1)$ The piezoelectric ceramic-polymer composite of this invention is prepared by the following procedure using the starting materials described above. In particular, the piezoelectric ceramic powder such as PZT is mixed with the particulate conductive or semiconductive third phase. The mixing is done such as by ball milling for about 2 hours. The polymer matrix is then added and mixed with the particulate phases and molded into shape. If the polymer matrix is a thermosetting resin, the molded composite can be cured at elevated temperatures.

EXAMPLE 1

FIG. 1 shows the sample preparation procedure used in this example. Commercial PZT-501 powder was obtained from Ultrasonic Powder Inc., South Plainfield, N.J., Eccogel 1365-0 (an eopxy formulation) was obtained from Emerson and Cuming, W. R. Grace and Co., Canton, Mass., and fine-grained carbon were used as piezoelectric filler, matrix, and additive to make 0-3 piezoelectric-ceramic composites. The PZT was mixed with the carbon powder and ball milled for 2 hours. The polymer matrix was then added to the particulate phase and mixed therein. The PZT compound comprised 68.5 vol. % of the PZt polymer composite. Samples were cut 1 cm×1 cm×0.1 cm. in dimension and an air-dry silver electrode was painted on both surfaces for poling and other transducer properties investigations.

The hydrostatic voltage coefficient $g_h$ is about 6 to 10 times larger than that of single phase PZ. Similarly, the FIG. of Merit $d_h g_h$ is $1\frac{1}{2}$ to 8 times larger than that of single phase PZT. The results are summarized in Table 2.

TABLE 2

Comparison of Dielectric and Piezoelectric Properties of PZT-Polymer Composites (with and without Conductive Third Phase)

| | Vol. % of Third Phase | tan δ | $K_{33}$ | $\bar{d}_{33}$ ($\times -12$ C/N) | $g_h$ ($\times -3$ Vm/N) | $\bar{d}_h$ ($\times -12$ C/N) | $\bar{g}_h \bar{d}_h$ ($\times -15$ m²/N) |
|---|---|---|---|---|---|---|---|
| Solid PZT | — | 0.015 | 1800 | 450 | 2.5 | 40 | 100 |
| PZT-Polymer Composite | 0 | 0.03 | 100 | 45 | 9 | 10 | 90 |
| PZT-Carbon-Eccogel | 1.5 | 0.08 | 120 | 50 | 30 | 30 | 900 |

TABLE 2-continued

Comparison of Dielectric and Piezoelectric Properties of
PZT-Polymer Composites (with and without Conductive Third Phase)

| Composite | Vol. % of Third Phase | tan δ | $K_{33}$ | $d_{33}$ ($\times -12$ C/N) | $g_h$ ($\times -3$ Vm/N) | $d_h$ ($\times -12$ C/N) | $g_h d_h$ ($\times -15$ m$^2$/N) |
|---|---|---|---|---|---|---|---|
| PZT-Ge-Eccogel Composite | 4 | 0.08 | 90 | 44 | 17 | 22 | 375 |
| PZT-Si-Eccogel Composite | 1.5 | 0.075 | 85 | 45 | 18 | 23 | 415 |

Polymer: Eccogel 1365-0
Volume Percent of Polymer is 30

EXAMPLE 2

Figure 2:
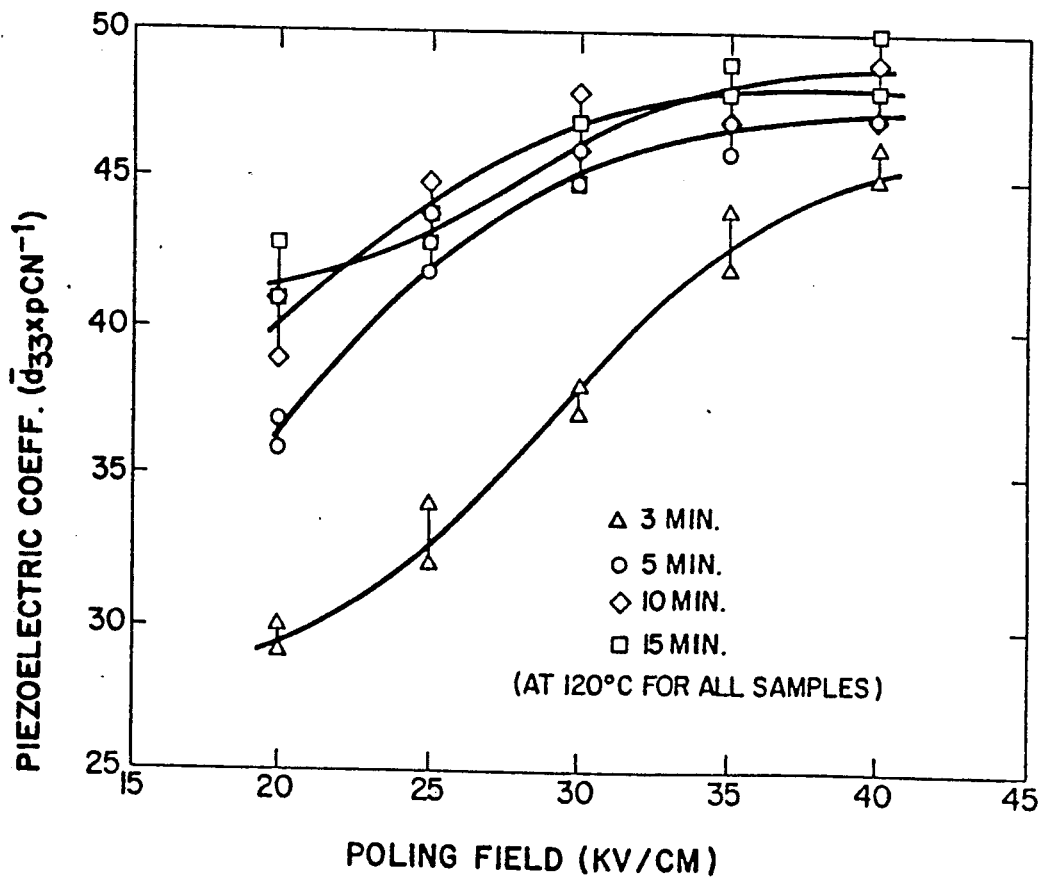
FIG. 2 is a graph of $d_{33}$ as a function of the poling field found during testing of piezoelectric composite samples.

FIG. 2 shows $d_{33}$ as a function of poling conditions. By optimizing $d_{33}$ coefficient, the poling behavior of carbon added PZT-Eccogel 0-3 composites were studied. PZT-Eccogel 0-3 samples with 1.5 volume percent carbon additive can be poles sufficiently in a 1209° C. oil bath, at 35 kV/cm, for about 5 minutes. This result is much improved poling behavior compared to 0-3 PZT-Eccogel composite without carbon additive. The optimized $d_{33}$ values varied between 48 to $50 \times 10^{12}$ C/N as shown in FIG. 2.

What is claimed is:

1. A transducer comprising a poled piezoelectric-polymer composite material of 0-3 connectivity and which comprises: a matrix of insulating polymer, a piezoelectric ceramic powder dispersed within said polymer matrix and an inorganic conductive or semiconductive particulate additive dispersed within said polymer matrix, said inorganic additive having an electrical conductivity greater than the electrical conductivity of said insulating polymer matrix.

2. The transducer of claim 1 wherein the said particulate additive in said composite comprises about 1.5 to about 4 volume % of said composite.

3. The transducer of claim 1 wherein said particulate additive has an electrical conductivity of at least about $10^{-3}$ ohm$^{-1}$cm$^{-1}$.

4. The transducer of claim 1 wherein said particulate additive comprises is a conductive metal.

5. The transducer of claim 1 wherein said particulate additive is a semiconductive material.

6. The transducer of claim 5 wherein said semiconductive material is carbon.

7. The transducer of claim 5 wherein said semiconductive material is germanium.

8. The transducer of claim 5 wherein said semiconductive material is silicon.

9. The transducer of claim 1 wherein said piezoelectric ceramic powder comprises at least about 60 vol. % of said ceramic powder and polymer mixture.

10. The transducer of claim 1 wherein said insulating polymer is an epoxy resin.

11. The transducer of claim 1 wherein said piezoelectric ceramic powder is lead zirconate titanate.

* * * * *

UNITED STATES PATENT OFFICE
CERTIFICATE OF CORRECTION

Patent No. 5,043,622                     Dated   August 27, 1991

Inventor(s) Geon Sagong et al

It is certified that error appears in the above-identified patent and that said Letters Patent is hereby corrected as shown below:

In the Abstract, line 1, please change "PET" to "PZT".

Signed and Sealed this

Twelfth Day of January, 1993

Attest:

DOUGLAS B. COMER

*Attesting Officer*     Acting Commissioner of Patents and Trademarks